(12) United States Patent
Costaganna et al.

(10) Patent No.: US 11,011,547 B2
(45) Date of Patent: May 18, 2021

(54) METHOD FOR FORMING A MICROELECTRONIC DEVICE

(71) Applicant: X-FAB FRANCE, Corbeil Essonnes (FR)

(72) Inventors: Pascal Costaganna, Chailly en Biere (FR); Pierre De Person, Cachan (FR); Michel Aube, Ponthierry (FR); Corentin Boulo, Evry (FR)

(73) Assignee: X-FAB France, Corbeil Essonnes (FR)

( * ) Notice: Subject to any disclaimer, the term of this patent is extended or adjusted under 35 U.S.C. 154(b) by 30 days.

(21) Appl. No.: 16/392,287

(22) Filed: Apr. 23, 2019

(65) Prior Publication Data

US 2019/0326183 A1 Oct. 24, 2019

(30) Foreign Application Priority Data

Apr. 24, 2018 (FR) ...................................... 1853572

(51) Int. Cl.
| | |
|---|---|
| *H01L 27/12* | (2006.01) |
| *H01L 21/84* | (2006.01) |
| *H01L 21/308* | (2006.01) |
| *H01L 21/8234* | (2006.01) |
| *H01L 21/3065* | (2006.01) |

(52) U.S. Cl.
CPC ...... *H01L 27/1203* (2013.01); *H01L 21/3065* (2013.01); *H01L 21/3081* (2013.01); *H01L 21/823412* (2013.01); *H01L 21/823481* (2013.01); *H01L 21/84* (2013.01)

(58) Field of Classification Search
None
See application file for complete search history.

(56) References Cited

U.S. PATENT DOCUMENTS

| 5,792,678 A | 8/1998 | Foerstner et al. |
| 6,403,435 B1 * | 6/2002 | Kang ................ H01L 21/76202 |
| | | 257/E21.546 |

(Continued)

FOREIGN PATENT DOCUMENTS

| EP | 3249689 A1 | 11/2017 |
| WO | 03054966 A1 | 7/2003 |

OTHER PUBLICATIONS

French Search Report from corresponding French Application No. 1853572, dated Jan. 8, 2019, pp. 1-6, National Institute of Industrial Property, France.

*Primary Examiner* — Andres Munoz
(74) *Attorney, Agent, or Firm* — Hauptman Ham, LLP

(57) ABSTRACT

A method for forming an electronic device comprising a first transistor and a second transistor, from a stack of layers comprising an isolating layer surmounted on an active layer made of a semi-conductive material, the method comprising at least the following steps: Forming an isolating trench to define, in the active layer, at least one first active region and at least one second active region, said isolating trench protruding with respect to the active layer of the second active region; Forming a masking layer without covering the active layer of the second active region and without covering a portion of the isolating trench; Etching: of a portion of the thickness of the active layer of the second active region, and of at least one portion of the thickness of said portion of the isolating trench.

21 Claims, 4 Drawing Sheets

(56) References Cited

U.S. PATENT DOCUMENTS

| | | | |
|---|---|---|---|
| 6,764,917 B1 * | 7/2004 | Chan | H01L 21/84 |
| | | | 257/E21.703 |
| 7,507,610 B2 * | 3/2009 | Yoshida | H01L 21/84 |
| | | | 438/149 |
| 9,786,755 B2 * | 10/2017 | Golanski | H01L 29/66545 |
| 10,062,712 B1 * | 8/2018 | Moen | H01L 21/31144 |
| 10,714,501 B2 * | 7/2020 | Fagot | H01L 21/7624 |
| 2004/0180478 A1 * | 9/2004 | Yang | H01L 21/84 |
| | | | 438/154 |
| 2006/0216898 A1 | 9/2006 | Tigelaar | |
| 2016/0071947 A1 | 3/2016 | Wiatr et al. | |
| 2017/0345724 A1 | 11/2017 | Costaganna et al. | |

* cited by examiner

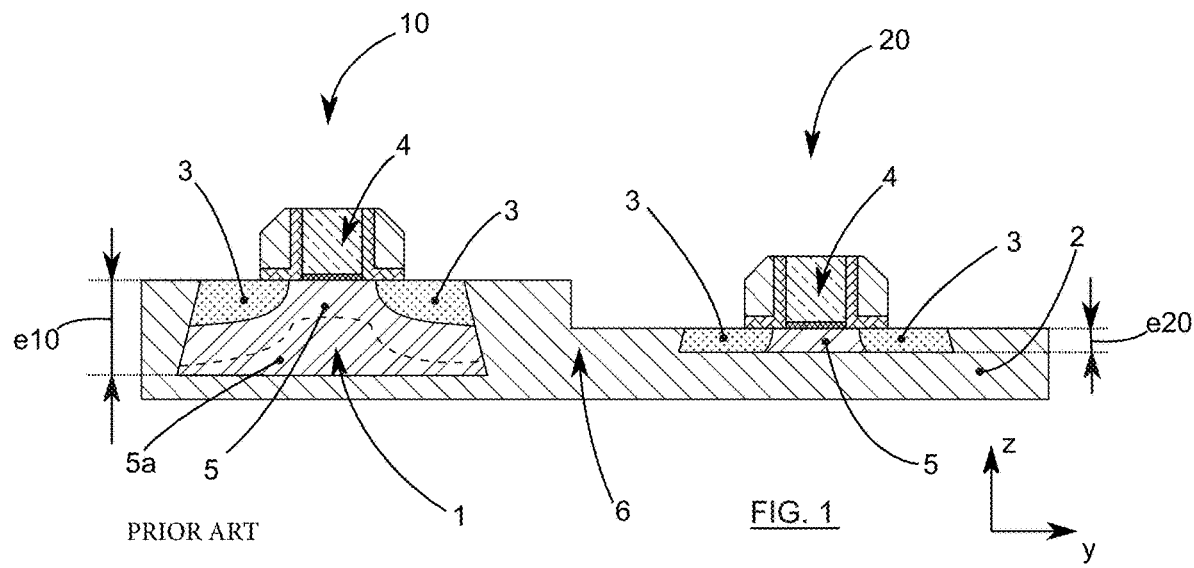
PRIOR ART FIG. 1
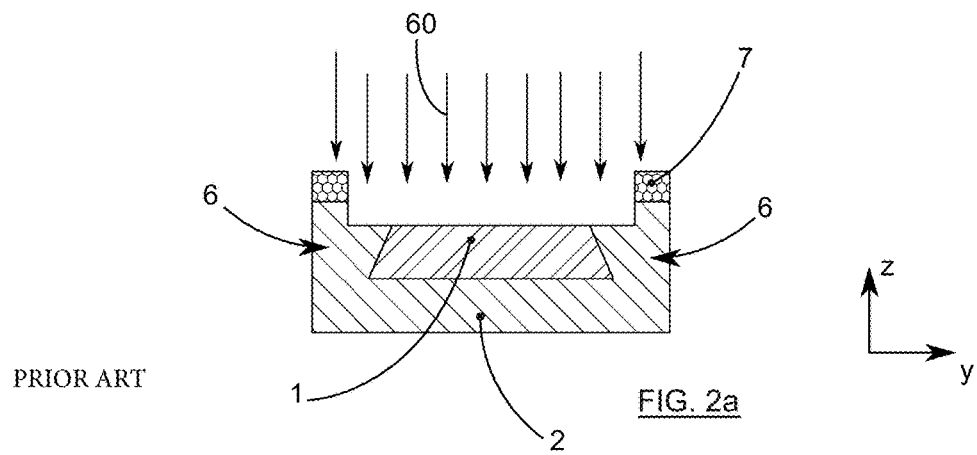
PRIOR ART FIG. 2a
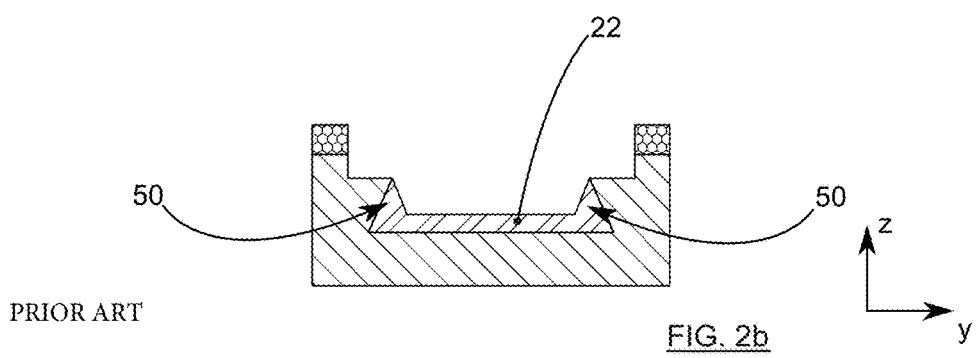
PRIOR ART FIG. 2b

METHOD FOR FORMING A MICROELECTRONIC DEVICE

TECHNICAL FIELD OF THE INVENTION

The present invention relates to the field of microelectronics and nanoelectronics. It has, for example, an advantageous application in the field of PDSOI partially depleted transistors PDSOI and fully depleted transistors FDSOI produced on one same plate.

STATE OF THE ART

In the field of integrated circuits formed from substrates, in particular, those developed from the Semiconductor On Insulator type (usually called SOI), there can be a plurality of transistors, of which the conduction channels have differences in thickness. This situation is met, for example but not exclusively, in the case of two types of transistors used: transistors called Partially Depleted Semiconductor On Insulator (PDSOI), and transistors called Fully Depleted Semiconductor On Insulator (FDSOI).

An SOI-developed substrate is characterised by the presence of a monocrystalline semiconductor thin, superficial layer, monocrystalline silicon, for example, resting on a continuous, isolating oxide layer, for example silicon oxide, called Buried Oxide (or also BOX) layer. The solidity and the mechanical rigidity of the assembly are ensured by a layer on which the BOX rests, and which constitutes the body of the SOI substrate, often called "bulk" to indicate that the starting substrate is most generally made of a solid semi-conductive material, silicon for example. This structure offers many advantages for producing Metal-Oxide-Semiconductor (MOS) transistors. In particular, it makes it possible for a drastic reduction of parasitic capacitance because of the presence of the continuous isolating layer.

The two types of FDSOI and PDSOI transistors meet the specific needs in the field of analogue and digital electronics, and more specifically in the field of radiofrequency electronics.

Electronic devices are thus known from the prior art, integrating on same electronic chips of FDSOI transistors and PDSOI transistors.

Thus, electronic devices such as that illustrated in FIG. 1 and which comprises a PDSOI transistor 10 and an FDSOI transistor 20 both mounted on one same SOI-type substrate are known, for example.

Generally, the two transistors are located in zones of the substrate separated by isolation trenches 6 also called Shallow Trench Isolation (STI) which pass through the active layer up to the BOX.

Each transistor has a source zone 3, a drain zone 3, a conduction channel 5 and a gate stack 4. It must be noted, that in this FIG. 1, the thickness of the active layer 1 defining the conduction channel 5 of the PDSOI transistor 10 is thicker than that of the FDSOI transistor 20. The active layer 1 carrying the PDSOI transistor 10 comprises the conduction channel 5 of the PDSOI transistor 10 as well as a zone called non-depletion 5a. While the active layer 1 of the FDSOI transistor 20 does not comprise any non-depletion zone 5a.

The formation of these two types of transistors on one same substrate, and more generally, the formation on one same substrate of transistors having different characteristics, such as different channel thicknesses, is not easy. In particular, the prior art has several solutions for forming these types of electronic devices. However, most of these solutions lead to transistors, of which the reliability is less than that expected, and in particular, for transistors of which the thickness of the channel is low, typically FDSOI transistors.

A lack of knowledge, even of the specific origin of these performance problems, leads to technical solutions, on the one hand, relatively complex and expensive to implement and on the other hand, not coming to achieve increased performances.

There is therefore a need consisting of responding to these various problems, while conserving a simple method and having a limited production cost.

The present invention aims to propose a solution to meet these needs.

SUMMARY OF THE INVENTION

The present invention relates to a method for forming an electronic device intended to house at least one first transistor, preferably of PDSOI type, and at least one second transistor, preferably of FDSOI type, the first transistor having a conduction channel, of which the thickness $e10$ is greater than the thickness $e22$ of a conduction channel of the second transistor, from a stack of layers comprising at least one isolating layer surmounted on at least one active layer made of a semi-conductive material, the method comprising at least the following steps:

a) Formation of at least one isolating trench through the thickness of the active layer to define in the active layer, on either side of the isolating trench, at least one first active region of the first transistor and at least one second active region of the second transistor, said isolating trench protruding with respect to at least the active layer of the second active region so as to form an initial displacement preferably called negative;

b) Formation, above the first active region and above a portion of the isolating trench, of at least one masking layer without covering the active layer of the second active region and without covering a portion, called uncovered, of the isolating trench;

c) Simultaneous etching, preferably dry etching:
  i) of a portion of the thickness of the active layer of the second active region so as to form at least one tapered active layer at the level of the second active region and to obtain, in the second active region, a thickness $e22$ of the tapered active layer, thinner than the thickness $e10$ of the first active region,
  ii) of at least one portion of the thickness of said uncovered portion of the isolating trench so as to form an etched portion of the isolating trench, and such that the tapered active layer protrudes with respect to the etched portion of the isolating trench so as to form a final displacement, preferably called positive.

The tapered active layer, being intended to partially form at least the conduction channel of the second transistor and the active layer of the first active region being intended to partially form at least the conduction channel of the first transistor.

The present invention advantageously takes advantage of a difference in level, also called difference in height and subsequently called displacement, between the surface of one or more isolating trenches and the surface of the active layer of the second active region. This makes it possible to ensure a better control of the thickness of the active layer intended to form at least one second transistor, for example of FDSOI type.

The present invention makes it possible to locally reduce the thickness of the active layer so as to make it possible for the formation of a transistor having a conduction channel, of which the thickness is less than that of the conduction channel of a transistor formed at least of the first active region.

Cleverly, the present invention makes it possible for the tapered active layer to have rounded edges, as illustrated in FIG. 3f, at the level of the tapered active layer/tapered isolating trench interfaces, which makes it possible to reduce the presence of structural anomalies at the level of these interfaces.

Indeed, it has been observed, during the development of the present invention, the presence of structural anomalies at the level of the interfaces between two materials of different types. In particular, the simultaneous etching of the active layer and of a portion of the isolating trench leads to the formation of structural anomalies at the level of the tapered active layer/tapered isolating trench interface.

These structural anomalies thus lead to a drop in the reliability of FDSOI transistors.

The present invention tends to limit, even avoid the presence of these structural anomalies.

The present invention makes it possible for the tapering of a portion of the active layer of a substrate so as to define zones capable of carrying FDSOI transistors and zones capable of carrying PDSOI transistors.

While in the prior art, illustrated for example through FIGS. 2a and 2b, the active layer and the isolating trench are at the same height, i.e. that the surfaces thereof are coplanar, the present invention cleverly uses a difference in height between these two surfaces.

A simultaneous etching of the active layer and of a portion of the isolating trench having an etching speed of the active layer greater than that of the isolating trench leads to structural anomalies as represented in FIG. 2b. These structural anomalies lead to reliability problems with FDSOI transistors.

Advantageously, the initial displacement called negative between the surface of the active layer and the surface of the isolating trench and preferably controlling the etching selectivity of the two different materials can act in synergy to lead to an absence of these structural anomalies and thus make it possible for an improvement of the reliability of FDSOI transistors, for example.

The present invention thus makes it possible to obtain FDSOI transistors having an improved reliability.

The present invention also relates to an electronic device intended to house at least one FDSOI-type fully depleted transistor and at least one PDSOI-type partially depleted transistor obtained by the method according to the present invention.

BRIEF DESCRIPTION OF THE FIGURES

The aims, purposes, as well as the characteristics and advantages of the invention will emerge best from the detailed description of an embodiment of the latter, which is illustrated by the following supporting drawings, wherein:

FIG. 1 illustrates a microelectronic device according to the prior art comprising a PDSOI transistor and an FDSOI transistor.

FIGS. 2a and 2b illustrate, according to the prior art, the formation of a structural anomaly during the simultaneous etching of an active layer and a portion of the isolating trenches delimiting this active layer.

Figure 3A:
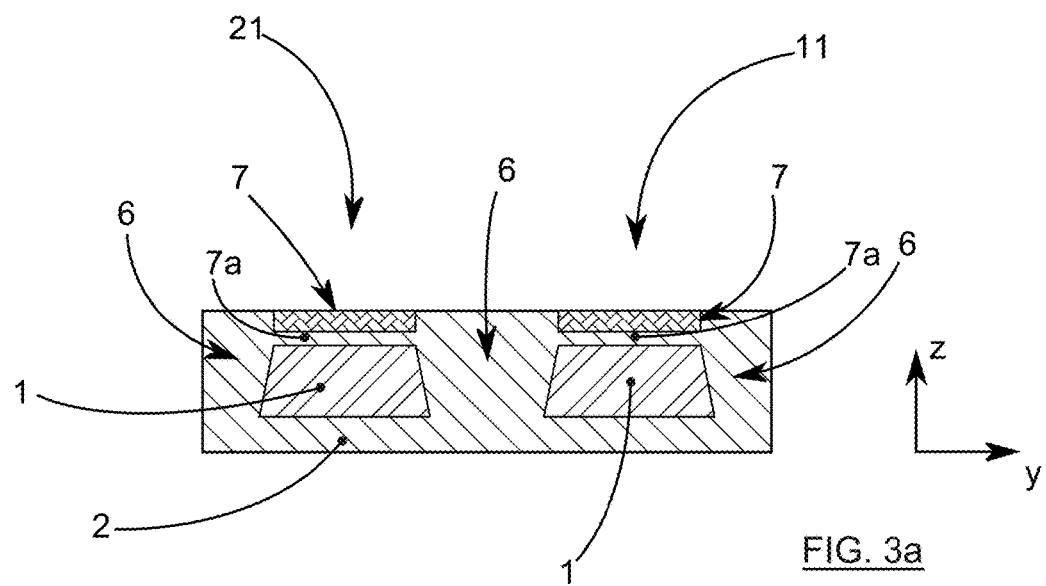
FIGS. 3a to 3h illustrate the steps of a method for producing a microelectronic device according to an embodiment of the present invention.

The appended drawings are given as examples and are not limiting of the invention. These drawings are schematic representations and are not necessarily to the scale of the practical application. In particular, the relative thicknesses of the different layers are not representative of reality.

DETAILED DESCRIPTION OF THE INVENTION

By PDSOI transistors, or more generally PDSOI device, this means a device constructed in a zone, of which the thickness is thicker than the maximum depletion layer $W_{d\_max}$ (excluding polarisation).

By FDSOI transistor, or more generally FDSOI device, this means a device constructed in a zone, of which the thickness is lower than the maximum depletion layer $W_{d\_max}$ (excluding polarisation).

The thickness of this maximum depletion layer $W_{d\_max}$ is given by the equation:

$$W_{d\_max} = (2\varepsilon_{si}\varepsilon_0 2\varphi_F/qN_A)^{1/2}$$

With:
$\varepsilon_{si}$: the relative dielectric constant of silicon;
$\varepsilon_0$: the absolute dielectric constant of the vacuum;

$$\varphi_F 32\ (kT/q)\ln(N_A/n_i);$$

k: the Boltzmann constant;
T: the temperature;
$n_i$: the intrinsic concentration of silicon carriers;
q: the elementary electrical charge;
$N_A$: the concentration of impurities.

Which, at the ambient temperature (300K), gives $\varphi_F = 0.0259\ \ln(N_A/1.5\times10^{10})$.

It is specified that in the scope of the present invention, the term "trench", "substrate" or "chip" or the equivalents thereof define a device advantageously comprising one or more semi-conductive layers and configured to receive the formation of transistor-type semi-conductive structures, for example.

It is specified that in the scope of the present invention, the term "SOI substrate", or the equivalents thereof define a substrate characterised by the presence of a monocrystalline semi-conductive superficial layer, monocrystalline silicon, for example, resting on a continuous, isolating oxide layer, for example silicon oxide, called buried oxide, or also BOX (buried oxide layer). The solidity and mechanical rigidity of the assembly are ensured by a support layer, for example, made of silicon.

It is specified that, in the scope of the present invention, the terms "on", "surmounts" or "underlying" or the equivalents thereof do not necessarily mean "in contact with". Thus, for example, the formation of a first layer on a second layer does not necessarily mean that the two layers are directly in contact with one another, but this means that the first layer covers, at least partially, the second layer by being, either directly on the contact thereof, or by being separated from it by another layer or another element.

The term "step" does not necessarily mean that the actions carried out during a step are simultaneous or immediately successive. Certain actions of a first step can be followed by actions linked to a different step, and other actions of the first step can then be repeated. Thus, the term "step" does not necessarily extend to single and inseparable actions over time and in the sequence of phases of the method.

By "nature" of a material, this means the chemical composition thereof and/or the crystallographic structure thereof, i.e. the spatial distribution of the elementary components thereof from a crystallographic standpoint. Thus, two materials of different natures are comprised of two materials having a different chemical composition and/or a different crystallographic structure.

In the present patent application, a structural anomaly is a discontinuity, or also a structural irregularity, preferably topographic or crystallographic or also stoichiometric. In the case of a structural anomaly of topographic order, this can be only present on the surface. In the case of a structural anomaly of crystallographic or stoichiometric order, this can have a magnitude in the substrate, even not be visible on the surface.

It must be noted, that these structural anomalies are mainly located at the interfaces between two materials of a different nature, and can be accentuated by an etching of these materials at the level of this interface.

In the following description, the thicknesses are generally measured along directions perpendicular to the plane of the lower face of the layer to be etched or of a substrate, on which the lower layer is arranged. Thus, the thicknesses are generally taken along the direction Z on the figures represented, i.e. the vertical direction.

In the following description, by "same height" or by the equivalents thereof, this means the fact that two separate surfaces are located in one same plane parallel to the substrate, i.e. relative to the figures of the non-limiting example, the fact that two separate surfaces are located in one same horizontal plane.

By "difference of levels between two surfaces", this means a difference of height between these two surfaces, i.e. that these two surfaces extend into different parallel planes.

Below, by "levelling" or "height adjustment" or by the equivalents thereof, this means the action of modifying the thickness of a layer, for example, such that the surface thereof is located in a different plane or in an identical plane of the surface of another layer, typically a horizontal plane relative to the figures of the non-limiting example.

In the scope of the present invention, "resin" is qualified as an organic or organo-mineral material which could be shaped by an exposure to an electron, photon or X-ray beam, or mechanically.

As an example of resins conventionally used in microelectronics, polystyrene-based resins (PS), methacrylate (for example, polymethyl methacrylate PMMA), hydrosilsesquioxane (HSQ), polyhydroxystyrene (PHS), etc. can be cited. The interest in using a resin, is that it is easy to deposit a significant thickness here, from several hundred nanometres to several microns.

Below, by "etching", this means the partial or total removal of a given material.

Below, by "wet etching", this means an etching technique requiring the use of a chemistry in a wet environment, by baths, generally.

Below, by "dry etching", this means an etching technique in a non-wet environment, and preferably by using a plasma.

Below, by:
"PDSOI zone", this means a zone of the substrate intended to receive at least one PDSOI transistor and comprising an active layer and a portion of the isolating trenches located on either side of the active layer in question.
"FDSOI zone", this means a zone of the substrate intended to receive at least one FDSOI transistor and comprising an active layer and a portion of the isolating trenches located on either side of the active layer in question.
"active PDSOI region" or "first active region", this means a region of the substrate comprising an active layer intended for the formation of at least one PDSOI transistor.
"active FDSOI region" or "second active region", this means a region of the substrate comprising an active layer intended for the formation of at least one FDSOI transistor.
"PECVD oxide", this means an oxide formed by plasma-enhanced chemical vapour deposition.
"LPCVD oxide", this means an oxide formed by chemical vapour deposition done under sub-atmospheric pressure.

Before starting a detailed review of embodiments of the invention, below are stated optional characteristics which can possibly be used in association or alternatively:
Advantageously, the isolating trench comprises at least one oxide formed by plasma-enhanced chemical vapour deposition; this oxide is called PECVD below.
Advantageously, the PECVD oxide is a silicon oxide.
Advantageously, the sacrificial oxide layer is formed by a step of oxidising on a portion of the thickness e10 of the active layer of the first active region.
According to an embodiment, the sacrificial oxide layer has a thickness of preferably between 2 nm and 20 nm, advantageously between 5 nm and 15 nm, and preferably equal to 7.5 nm.
Advantageously, the sacrificial oxide layer has a thickness of preferably between 6 nm and 15 nm, and advantageously equal to 5 nm.
Advantageously, the dry etching is an etching by plasma.
Advantageously, the plasma is a high-density plasma.
Advantageously, the active layer has an initial thickness of preferably between 100 nm and 200 nm, advantageously between 125 nm and 180 nm, and preferably equal to 140 nm.
Advantageously, the active layer of the first active region has a thickness of preferably between 100 nm and 200 nm, advantageously between 125 nm and 180 nm, and preferably equal to 140 nm.
Advantageously, the tapered active layer of the second active region has a thickness of preferably between 25 nm and 100 nm, advantageously between 50 nm and 85 nm, and preferably equal to 75 nm.
Advantageously, the dry etching step is followed by a step of wet cleaning the surface of the etched zones.
Advantageously, the step of wet cleaning the surface of the etched zones is configured to remove residual materials coming from the dry etching step.
Advantageously, the residual materials are oxides of the semi-conductive material.
Advantageously, the isolating trench is in contact with the isolating layer.
According to one embodiment, the thickness of the isolating trench is between 100 nm and 200 nm, advantageously between 150 nm and 200 nm, and preferably equal to 175 nm.
Advantageously, the wet cleaning step is carried out with a hydrofluoric acid base of DHF/SC1/SC2 type and comprises the following parameters:
DHF18 SC1 SC2 on FSI
HF 170 cc/mn+DI hot water 1700 cc/mn 88 sec
SC1: H2O2 200 cc/mn NH4OH 125 cc/mn DI hot water 1500 cc/mn 45 sec
NH4OH 40 cc/mn DI hot water 1600 cc/mn 180 sec
SC2: HCL 40 cc/mn H2O2=200 cc/m, DI hot water 1600 cc/mn Advantageously, the etching step is carried out by an etching having an etching speed of the active layer less than the etching speed of the isolating trench.

This makes it possible to taper the active layer and a portion of the isolating trench while ensuring the absence of structural anomalies on the active layer/isolating trench interface.

Advantageously, the first transistor is a PDSOI-type transistor (Partially Depleted Semiconductor On Insulator).

Advantageously, the second transistor is an FDSOI-type transistor (Fully Depleted Semiconductor On Insulator).

Advantageously, the etching step is carried out by an etching having an etching speed of the isolating trench greater than or equal to once and less than or equal to twice the etching speed of the active layer.

This makes it possible to taper the active layer and a portion of the isolating trench while ensuring the absence of structural anomalies on the active layer/isolating trench interface, and this makes it possible to taper the active layer and a portion of the isolating trench while ensuring that the desired thickness of the tapered active layer is achieved, before the isolating trench is fully tapered, i.e. before the BOX is achieved.

Advantageously, before said etching step, said isolating trench protrudes with respect to the active layer of the second active region, such that the difference in height h1 between the surface of the isolating trench and the surface of the active layer of the second active region is between 0 and 40 nm, preferably between 5 nm and 30 nm, and advantageously equal to 5 nm.

Advantageously, after said etching step, the tapered active layer of the second active region protrudes with respect to the etched portion of the isolating trench, such that the difference in height h2 between the surface of the tapered active layer and the surface of the etched portion of the isolating trench is between 7 nm and 68 nm, preferably between 21 nm and 56 nm, and advantageously between 28 nm and 49 nm.

Advantageously, the ratio between h2 and the thickness e22 of the tapered active layer of the second active region is between 0.1 and 0.9, preferably between 0.3 and 0.8 and advantageously between 0.4 and 0.7, and the ratio between h1 and the thickness e10 of the active layer of the first active region is less than 0.3, preferably less than 0.1 and advantageously less than 0.05.

Advantageously, the ratio between the thickness e22 of the tapered active layer of the second active region and the thickness e10 of the active layer of the first active region is between 0.41 and 0.62, preferably between 0.45 and 0.59 and advantageously between 0.48 and 0.55.

Advantageously, the thickness e22 of the tapered active layer of the second active region is between 60 nm and 90 nm, preferably between 65 nm and 85 nm and advantageously between 70 nm and 80 nm, and the thickness e10 of the active layer of the first active region is between 130 nm and 160 nm, preferably between 135 nm and 155 nm and advantageously between 140 nm and 150 nm.

Advantageously, dry etching is an etching by plasma, preferably the plasma being a high-density plasma.

Advantageously, the parameters of dry etching by plasma are:
a) $1^{st}$ phase (called Breakthrough)
  i) Source power TCP 900 W;
  ii) Pressure 10 mT;
  iii) Pressure of helium (He) on the trench back (He Cooling) 8 T;
  iv) CF4 60 sccm (Standard Cubic Centimetres per Minute, flow in cubic centimetres per minute measured under standard temperature and pressure conditions);
  v) CHF3 40 sccm
  vi) He 150 sccm
  vii) Polarisation voltage 385V;
b) $2^{nd}$ phase (called silicon etching)
  i) Source power TCP 600 W;
  ii) Pressure 52 mT;
  iii) Pressure of helium on the trench back (He Cooling) 8 T;
  iv) CF4 50 sccm CHF3 40 sccm;
  v) Polarisation voltage 250V Advantageously, said masking layer comprises at least one resin.

This makes it possible to protect the first active region intended to house PDSOI transistors.

Advantageously, the method comprises, after the etching step, a step of removing said masking layer.

Advantageously, the step of removing said masking layer is followed by a step of cleaning one portion at least of the tapered active layer of the second active region, preferably by a wet etching.

Advantageously, the method comprises, after the step of removing the masking layer, a step of forming at least one superficial oxide layer at the level at least of the tapered active layer of the second active region.

This makes it possible to restore the surface state of the tapered active layer.

Advantageously, the sacrificial oxide layer is formed by a step of oxidising on a portion of the thickness e22 of the tapered active layer of the second active region.

Advantageously, the step of forming the superficial oxide layer comprises at least one oxidation step at a temperature between 500° C. and 1100° C. of at least one portion of the tapered active layer of the second active region so as to form said sacrificial oxide layer.

Advantageously, the sacrificial oxide layer has a thickness of preferably between 3 nm and 20 nm, and advantageously equal to 5 nm.

Advantageously, the active layer has an initial thickness e1 of between 130 nm and 160 nm, preferably between 135 nm and 155 nm and advantageously between 140 nm and 150 nm.

Advantageously, the isolating trench is in contact with the isolating layer.

One non-limiting embodiment of the present invention will now be described based on FIGS. 3a to 3h.

The present invention provides a method for producing, on one same substrate, for example SOI, transistors having conduction channels, of which the thicknesses are different. For example, but in a non-limiting manner, certain transistors can be of PDSOI type and certain transistors, of FDSOI type.

A substrate, for example SOI, can comprise a thin superficial layer of a monocrystalline semi-conductor, advantageously monocrystalline silicon, called active layer 1. This active layer 1 rests on an isolating layer 2. Preferably, this isolating layer 2 itself rests on a support layer, not represented.

According to one embodiment, of which the result is illustrated by FIG. 3a, from an SOI substrate, an intermediate oxide layer 7a is formed on the assembly of the surface of the substrate. This intermediate oxide layer 7a preferably comprises silicon oxide. It will be noted, that in these figures, silicon oxide is represented identically, that it is the isolating layer called BOX 2 or the intermediate oxide layer 7a, or also isolating trenches 6.

According to one embodiment, a hard mask 7, comprising for example, a nitride layer, is deposited on the assembly of the intermediate oxide layer 7a. This hard mask 7 can advantageously be formed by plasma-enhanced chemical vapour deposition called LPCVD (Low-Pressure Chemical Vapour Deposition) oxide.

According to one embodiment, the chemical composition of this hard mask 7 is Si3N4.

Once these two layers (7 and 7a) formed of a series of lithographic steps makes it possible to form isolating trenches 6 called STI (Shallow Trench Isolation) illustrated in FIG. 3a.

Highly advantageously, but in a non-limiting manner, these isolating trenches 6 are formed by chemical vapour deposition carried out at sub-atmospheric pressure or by PECVD (Plasma-enhanced chemical vapour deposition), so as to form an oxide called PECVD oxide. Preferably, these isolating trenches 6 are formed from a PECVD silicon oxide.

Preferably, the isolating trenches 6 are in contact with the isolating layer 2.

A formation method that can be considered of these isolating trenches 6 is based on the use of conventional lithographic techniques, in order to form trenches in the substrate. These trenches are then filled with an oxide, advantageously a PECVD silicon oxide.

On either side of these isolating trenches 6, regions of the active layer 1 are defined. A first active region 11 is intended to form transistors having conduction channels of thickness e10, and for example non-limiting of PDSOI transistors 10. A second active region 21 is intended to form transistors having conduction channels of thickness e20 with e10 being greater than e20, and for example non-limiting of FDSOI transistors 20.

In the description below, reference will be made to PDSOI and FDSOI transistors, without this being limiting. All the characteristics, steps and advantages mentioned in the present description and illustrated in the figures are applied to embodiments, wherein the transistors are not necessarily of PDSOI and FDSOI type, but wherein one or more first transistors have conduction channels, of which the thicknesses are greater than those of the conduction channels of one or more second transistors.

Thus, in the description below, the expression "PDSOI transistor(s)" can be replaced with "first transistor(s)" and "FDSOI transistor(s)" with "second transistor(s)".

Figure 3B:
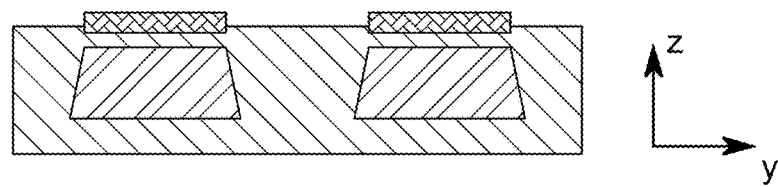

Once the isolating trench(es) 6 is/are formed, a cleaning step, illustrated by FIG. 3b can be carried out. This step of cleaning the surface of the microelectronic device can be carried out via a dry etching by plasma and/or a wet etching. This etching step is carried out such that the hard mask 7 protrudes relative to the surface of the isolating trenches 6.

Figure 3C:
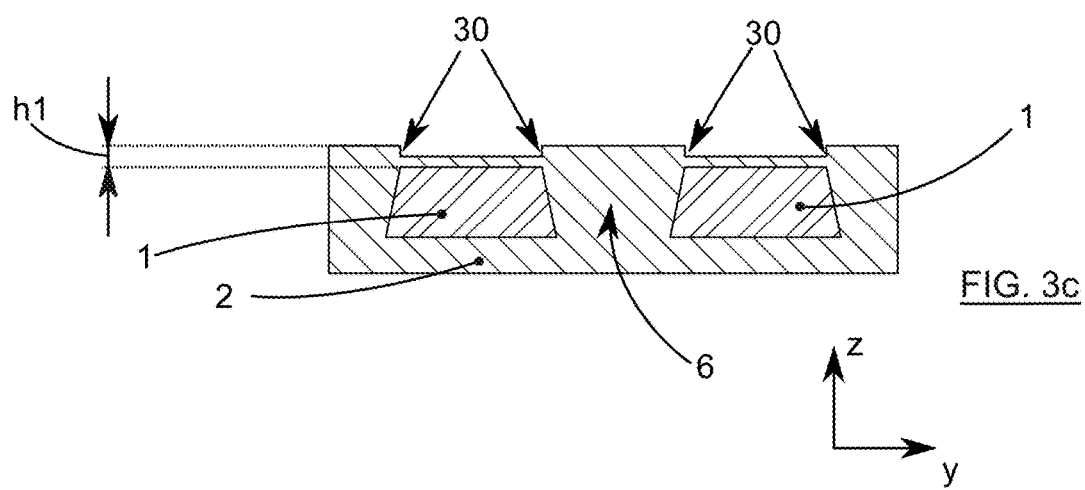

FIG. 3c represents the removal of the hard mask 7, preferably selectively on the PECVD oxide layer, so as to expose the intermediate oxide layer 7a. This removal is advantageously done at the level of the second active region 21, i.e. from the zone to subsequently be tapered. Advantageously, this removal is done before the step of tapering the active layer 1 of the second active region 21.

According to one embodiment, this removal can be done at the level of the first 11 and of the second 21 active regions before the step of tapering the active layer 1 of the second active region 21.

The removal of the hard mask 7 makes it possible to form an initial displacement 30. Indeed, the removal of the hard mask 7 leads to a difference in level between the isolating trenches 6 and the surface of the active layer 1 of the first and of the second active regions 11 and 21.

According to one advantageous embodiment of the present invention, the removal of the hard mask 7 is configured such that the surface of the isolating trench(es) 6 are located at a height, taken along the direction z, greater than that of the surface of the intermediate oxide layer 7a, or at least greater than that of the surface of the active layer 1. Thus, FIG. 3c represents, according to one embodiment of the present invention, the formation of an initial displacement 30 called negative between the surface of the first 11 and second 21 active regions and the surface of the isolating trenches 6 surrounding them.

By "displacement", this means, between two surfaces, the existence of a difference in height to the extent that the two surfaces in question extend into substantially parallel, but non-coplanar planes. More generally, a displacement between a first and a second surface will be referred to, as soon as there is a change in height, i.e. of level, between the first and the second surface.

A negative displacement will be referred to, as soon as it is the surface of the isolating trenches 6 which are located at a greater height relative to the surface of the active layer 1 of the first 11 and second 21 active regions.

A positive displacement will be referred to, as soon as it is the surface of the active layer 1 of the first 11 and/or second 21 active regions which are located at a greater height relative to the surface of the isolating trenches 6.

Advantageously, the initial displacement 30 called negative, i.e. the difference in height h1 between the surface of the isolating trench 6 and the surface of the second active region 21, is between 0 nm and 40 nm, preferably between 5 nm and 30 nm and advantageously equal to 5 nm.

As presented below, this displacement called negative makes it possible for a better control of the thickness and advantageously of the profile of the tapered active layer 22 during later steps of producing transistors at the level of the second active layer 21, for example during the production of an FDSOI transistor 20.

Figure 3D:
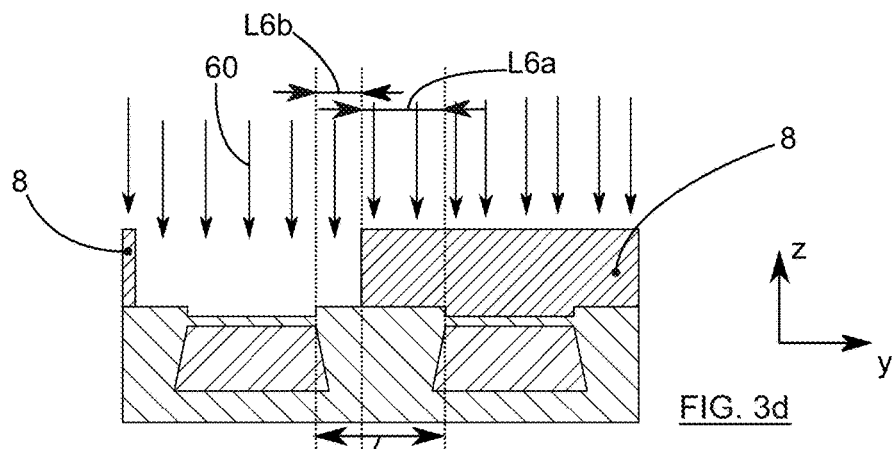

FIG. 3d presents a step of depositing a masking layer 8, for example, a mask called "soft mask" 8, for example a resin, at the level of a portion of the isolating trenches 6 and at the level of the first active region 11. This mask 8 represented by a masking layer 8 makes it possible to protect the first active region 11 and a portion of the isolating trenches 6 during later steps of producing the FDSOI transistor 20 and mainly during the step of etching the second active region 21.

Thus, FIG. 3d illustrates the deposition above the first active regions 11 of a resin layer 8. According to one preferred embodiment, the resin layer 8 is deposited so as to cover a portion of the isolating trenches 6, preferably over a width L6a, taken along the axis y, for example between 0.5 µm and 4 µm.

Advantageously, the resin layer 8 is deposited so as to leave exposed a portion of the isolating trenches 6 in the proximity of the second active region 21, preferably over a width L6b, taken along the axis y, between 0.5 µm and 4 µm. The resin layer 8 is opened by one of numerous known lithographic methods, for example, photolithography if it is a photosensitive resin.

According to one embodiment, the width L6 of the isolating trench 6 is between 1 µm and 8 µm.

Advantageously, the width L6b of the isolating trench 6 not covered by the resin layer 8 is between 20% and 80%, preferably between 30% and 70% and advantageously equal to 50% of the width L6 of the isolating trench 6.

Preferably, the width L6a of the isolating trench 6 covered by the resin layer 8 is between 20% and 80%, preferably between 30% and 70% and advantageously equal to 50% of the width L6 of the isolating trench 6.

According to one embodiment, the width L6b of the isolating trench 6 not covered by the resin layer 8 is equal to the width L6a of the isolating trench 6 covered by the resin layer 8.

FIG. 3d also represents the dry or wet etching step 60. This etching aims to remove the intermediate oxide layer 7a and to taper the second active region 21.

Preferably, it is a dry etching 60, for example done by plasma, preferably by a high-density plasma. In the case of a dry etching, the high-density plasma is advantageously based on a fluorocarbon chemistry.

Preferably, this dry etching 60 is configured to taper a portion of the isolating trenches 6, portion belonging to the second active region 21.

Particularly cleverly, this dry etching 60 is configured to simultaneously taper two materials of different natures.

Thus, it must be noted, that the selectivity of this dry etching 60 relative to the second active region 21 and to the isolating trenches 6 can be a parameter to be considered.

Indeed, for example, the active layer 1 can comprise silicon, preferably monocrystalline, and the isolating trenches 6 can comprise a silicon oxide, preferably a PECVD silicon oxide. Due to the difference in nature of these two materials, the etching speed thereof is different.

The present invention considers this difference in speed and proposes a solution, such that it does not damage the production of the transistor at the level of the second active region 21, for example of the FDSOI transistor 20, while carrying out this tapering in one single and same etching step.

Advantageously, this etching 60 has a greater selectivity of silicon oxide relative to silicon. In particular, the parameters of this etching makes it, such that it has an etching speed of the isolating trenches 6 of between once and twice, preferably between 1.1 times and 1.5 times, the etching speed of the active layer 1.

Preferably, but in a non-limiting manner, the initial negative displacement and this particular selectivity can act in synergy to make it possible for a tapering of the active layer 1 of the second active region 21, while preventing the isolating trenches 6 from being fully etched according to the thickness thereof.

In addition, this initial negative displacement and this etching 60, preferably, but in a non-limiting manner, through this particular selectivity, make it possible to form structural anomalies 50 on the tapered active layer/tapered isolating trench interfaces. These structural anomalies 50 mainly find, as the origin, the anisotropic character of dry etchings and simultaneous etching with different etching speeds of two different materials. These structural anomalies 50 then cause problems with topographic and/or crystallographic discontinuities.

These structural anomalies 50 can thus reduce performances and/or reliability of the transistor to form, at the level of the second active region 21, for example of the FDSOI transistor 20.

The present invention resolves these problems, by producing isolating trenches 6 protruding relative to the active layer 1 to be tapered. Moreover, to also improve the results obtained, preferably etching parameters are selected to control the selectivity of the active layer 1 relative to the isolating trenches 6. In this configuration, the simultaneous etching of the active layer 1 and of a portion of the isolating trenches 6 makes it possible for a tapering of the active layer 1 of the second active region 21, while limiting, even avoiding, the formation of structural anomalies 50.

Indeed, it has been observed, during the development of the present invention, that a step of dry etching 60 the active layer 1 and a portion of the isolating trenches 6 leads to the formation of structural anomalies 50, such as troughs, at the level of the junction between the tapered region of the active layer and the etched portions 6b of the isolating trenches 6.

These troughs directly result from the nature of the dry etching 60 at the interface between two different materials and lead to the later formation of rails of polycrystalline material in the subsequent steps of forming transistors at the level of the second active region 21, i.e. during the formation of FDSOI transistors 20, for example.

These structural anomalies 50 can thus be the base of a point effect, i.e. of a local deformation of the electrical field during the functioning of the transistor thus formed. This point effect leads to a significant concentration of the electrical field locally located at the level of these structural anomalies 50. This event thus leads to a quick degradation of the transistors thus formed.

Thus, these troughs degrade the reliability of FDSOI transistors 20. However, during the development of the present invention, the effects of these troughs on the reliability of the transistors formed at the level of the second active region 21, for example FDSOI transistors 20, have been able to be controlled. Surprisingly, the step of forming isolating trenches 6 protruding relative to the active layer 1 and preferably the adjustment of the etching selectivity of these two materials make it possible to particularly effectively control the formation of these structural anomalies 50 during the step of simultaneously etching 60 the active layer 1 of the second active region 21 and of a portion of the isolating trenches 6. Thus, these structural anomalies 50 do not damage the reliability of the transistors of the second active region 21, for example, FDSOI transistors 20.

In particular, this etching step 60 makes it possible to form a tapered active layer 22 having rounded edges 22a and not structural anomalies 50.

According to one preferred embodiment, this dry etching 60 can be subjected to a retroactive loop for measuring the etched thickness, advantageously by interferometry. Thus, the etching 60 is done by multiple successive etchings, separated by an interferometric measurement of the thickness consumed of the materials in question and preferably of the active layer 1 of the second active region 21.

Figure 3E:
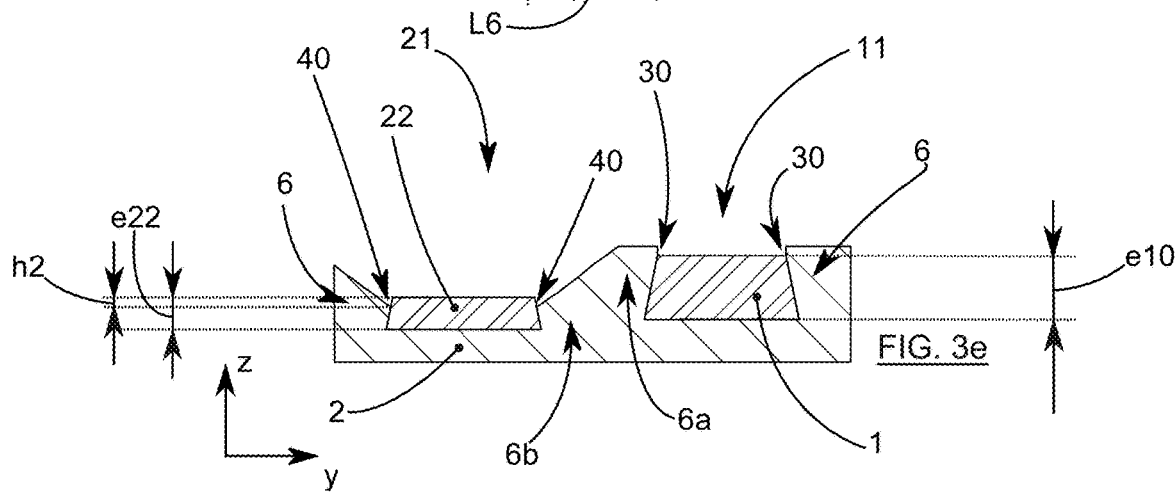

FIG. 3e represents a step of removing the resin layer 8, as well as the morphology of the first and second active regions 11 and 21 after the etching step 60. In particular, the tapered active layer 22 of the second active region 21 will be noted.

According to one embodiment, the thickness e22 of the tapered active layer 22 is between 25 nm and 200 nm, preferably between 50 nm and 100 nm and advantageously equal to 75 nm.

Preferably, this thickness e22 of the tapered active layer 22 corresponds to the at least one thickness e20 of at least one conduction channel of the second transistor 20, for example the thickness e22 corresponds to the thickness e20 of the conduction channel of the FDSOI transistor 20.

Preferably, the ratio between the thickness e10 of the active layer 1 of the first active region 11 and the thickness e22 of the tapered active layer 22 of the second active region 21 is between 0.25 and 0.75, preferably between 0.35 and 0.65 and advantageously equal to 0.5.

It must be noted, that one of the advantages of this etching step 60 is the possibility of reaching an optimal thickness of the tapered active layer 22 of around 75 nm to form FDSOI transistors 20, for example.

The materials involved in this dry etching step 60 have been selected and furthermore formed in order to satisfy the conditions of relative etching speeds in order to obtain the result illustrated in FIG. 3e. In particular, it is preferable that the etching speed of the material of the isolating trench 6, typically silicon oxide, is greater than or equal to that of the active layer 1 (typically made of silicon, silicon-germanium or also germanium).

It will also be noted, that in this figure, the gradient of the surface of the etched portions 6b of the isolating trenches 6. This gradient is a function of both the etched thickness of the isolating trench(es) 6, and also the width L6b (measured along the axis y) of the portion of the isolating trench 6 not covered by the resin layer 8 and which is therefore exposed during the etching step 60. FIG. 3d illustrates this dimension L6b.

According to the embodiment illustrated, the angle a6 (illustrated in FIG. 3f) between the surface of the etched portion 6b of the isolating trench 6 and the surface of the tapered active layer 22 is between 25° and 65°, preferably between 35° and 55° and advantageously equal to 45°.

This gradient is a consequence of the etching conditions 60 at the ends of the portion of the isolating trench 6 not covered by the resin layer, i.e. relative to the active layer/isolating trench interface and to the isolating trench/resin layer interface 8.

Finally, the presence of a final displacement 40 called positive will be noted in FIG. 3e. Indeed, from this etching step 60, the surface of the tapered active layer 22 is located at a height, along the direction z, greater relative to the height of the surface of the etched portions 6b of the isolating trenches 6, at least on the surface of the etched portions 6b of the isolating trenches 6 in contact, preferably directly, of the tapered active layer 22.

Advantageously, the difference in height h2 between the surface of the tapered active layer 22 and the surface of the etched portions 6b of the isolating trenches 6 is between 0.1 and 0.9, preferably between 0.3 and 0.8 and advantageously between 0.4 and 0.7 times the thickness e22 of the tapered active zone 22.

Figure 3F:
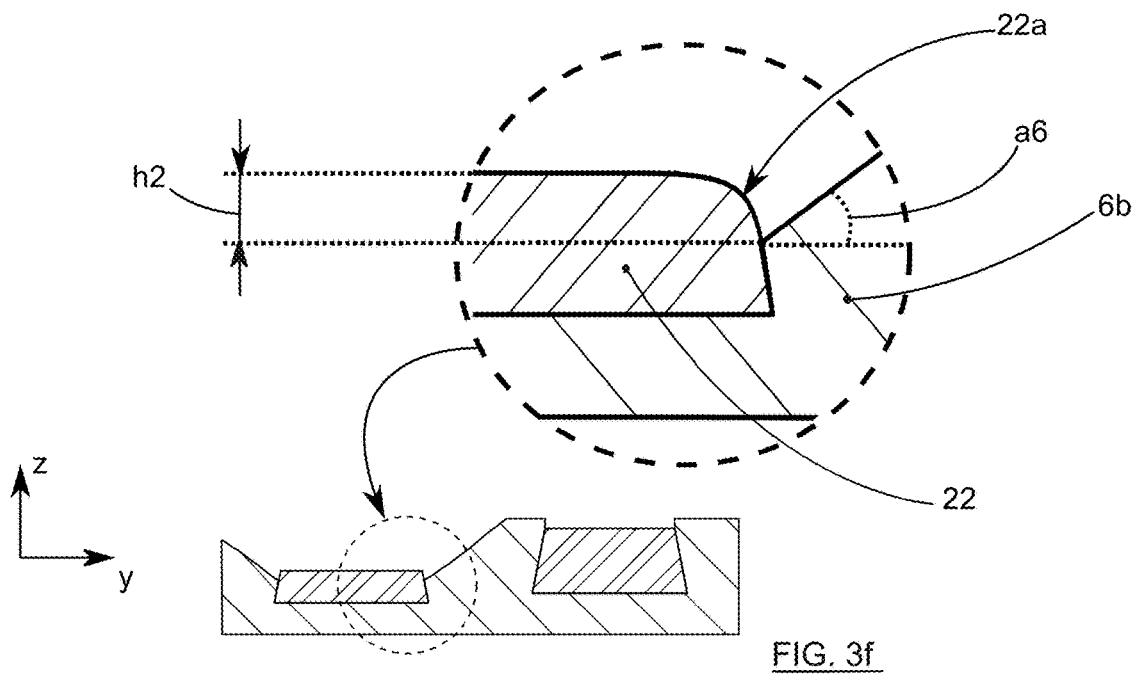

In particular, this positive final displacement 40 is characterised by the presence of a rounded edge 22a of the tapered active layer 22. FIG. 3f illustrates, in particular, an extension of a rounded edge 22a of the tapered active layer 22.

The curve of these edges 22a makes it possible, to reduce, even avoid the point effect described above. Indeed, the rounded shape of the edges 22a of the tapered active layer 22 makes it possible to homogenise the electrical field at the level of the edges 22a.

The reliability of the transistors thus formed is improved.

The presence of a negative displacement 30 at the level of the first active region 11 between the active layer 1 and the isolating trench(es) 6 will also be noted.

According to one embodiment, a step of shaping the edges of the active layer 1 of the first active region 11 can be carried out. This step can comprise the formation of an oxide at the level of the active layer 1 of the first active region 11 and the consumption thereof, so as to round the edges of the active layer 1 of the first active region 11.

As above, the rounded edges make it possible to improve the reliability of the transistors formed at the level of the first active region 11, for example PDSOI transistors 10.

A wet cleaning step can follow the dry etching 60. This wet cleaning is configured to remove a residual oxide layer of all of the surfaces in question.

For example, this wet cleaning can be done with a hydrofluoric acid base, preferably diluted.

Figure 3G:
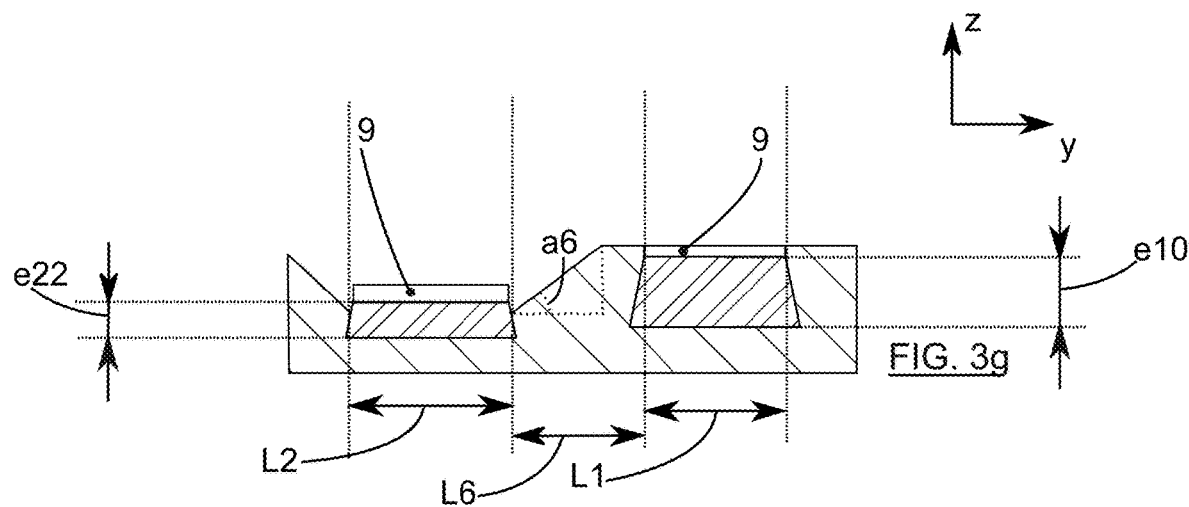

FIG. 3g represents a step of forming a sacrificial oxide layer 9 and of partial or total removal of this sacrificial oxide layer 9. This sacrificial oxide layer 9 makes it possible to improve the surface condition of the tapered active layer 22 by eliminating the surface defects of the tapered active layer 22 induced by the etching 60. Indeed, the surface of the tapered active layer 22 results from an etching 60 which can leave this surface damaged at the crystallographic level over a very low thickness of around a few nanometres, for example. The partial removal of this sacrificial oxide layer 9 thus makes it possible to remove the damaged portion of the surface, by only leaving a residual sacrificial oxide layer, of which the surface no longer has this structural damage.

In addition, the formation and the partial removal of this sacrificial oxide layer 9 makes it possible for an adjustment of the thickness of the tapered active layer 22.

Likewise, the formation and the partial removal of this sacrificial oxide layer 9 makes it possible for an adjustment in the height of the first active region 11 relative to the surface of the non-etched portions 6a of the isolating trenches 6. In addition, this also makes it possible for an improvement of the surface condition of the first active region 11.

These adjustments in thickness, also called "height adjustments", thus comprise at least the formation of the sacrificial oxide layer 9 and/or the removal of one portion at least of this sacrificial oxide layer 9.

This sacrificial oxide layer 9 advantageously comprises at least one oxidation step at a temperature of between 500° C. and 1100° C. of the second tapered active region 21 and preferably of the first active region 11.

The formation of this oxide layer and the at least partial removal thereof can cooperate with the curve of the edges of the active layer 1 and of the tapered active layer 22 in order to reduce even avoid the point effect and thus improve the reliability of the transistors.

Surprisingly, it has been observed that the formation of a sacrificial oxide layer 9 at the level of the second active region 21 over a thickness, preferably less than 90% of the thickness of the tapered active layer 22 makes it possible for an improvement of the curve of the edges of the tapered active layer 22.

Preferably, at the level at least of the second active region 21, the thickness of the sacrificial oxide layer 9 is between 10% and 90% of the thickness of the tapered active layer 22.

In addition, the residual sacrificial oxide layer, i.e. which results from the partial removal of the sacrificial oxide layer 9, makes it possible to form a screen to the ionic implantations later carried out to produce a transistor. This screen ensures a better implantation homogeneity by avoiding the channelling effects and it also makes it possible to limit the structural damage due to the ionic implantations.

Thus, one single height adjustment step makes it possible to restore a surface structure with no defects and to make it possible for future ionic implantations and in certain cases, to adjust the height of the surface of an active layer 1 relative to the surface of the isolating trenches 6.

Thus, the present invention can comprise an ionic implantation step. Advantageously, this ionic implantation step can comprise two sub-steps corresponding to a first ionic implantation of the first active region 11 followed by a second ionic implantation of the second active region 21. This thus makes it possible to have several degrees of freedom in selecting doses and implanted elements in order to meet the various needs in terms of characteristics of transistors, for example PDSOI 10 and FDSOI 20.

According to one embodiment, and as discussed above, this ionic implantation step can advantageously benefit from the presence of residual sacrificial oxide layers at the level of the first 11 and second 21 active regions, in order to ensure a proper implantation homogeneity and to limit the ionic implantation structural defects.

Figure 3H:
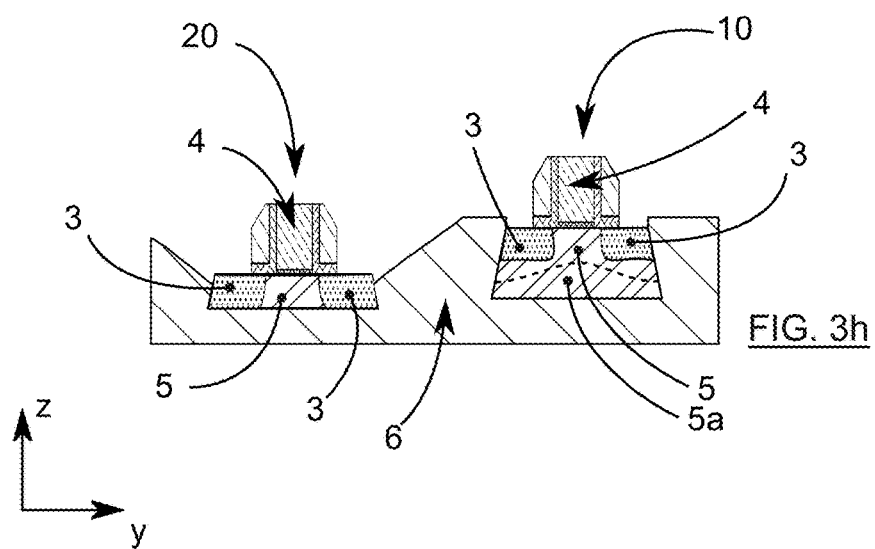

FIG. 3h illustrates, according to one embodiment, an FDSOI transistor 20 formed above the second active region 21 and a PDSOI transistor 10 formed above the first active region 11.

In this figure, each transistor 10 and 20 is illustrated briefly. Each transistor 10 and 20 comprises at least one source zone 3 and a drain zone 3, a gate stack 4 preferably comprising a plurality of layers and potentially spacers electrically isolating the flanks of each gate stack 4 of the source 3 and drain 3 zones.

FIG. 3h makes it possible to illustrate the position of a first type of transistor, for example PDSOI 10, and of a second type of transistor, for example FDSOI 20, with respect to the first and second active regions 11 and 21 according to one embodiment of the present invention.

The present invention relates to a method for producing an electronic device capable of forming, on one same silicon trench, transistors having different conduction channel thicknesses, and for example, PDSOI and FDSOI transistors. The present invention comprises steps which have been studied, developed and optimised in order to have between them, a synergy so as to reduce the production costs of such a device, while not sacrificing any performance, nor the reliability of these types of electronic devices.

Thus, some of these steps have multiple effects, in order to reduce the total number of necessary steps.

Thus, in view of the description above, it clearly appears that the present invention proposes an effective solution to improve the reliability of a transistor. The invention is based, in particular, on a relative configuration of the active layer, and the isolating trenches and preferably a selection of clever etching parameters so as to not form possible structural anomalies at the level of the edges of the tapered active layer.

The invention is not limited to the embodiments described above, and extends to all embodiments covered by the claims.

REFERENCES

1. Active layer
e1. Thickness of the active layer
2. Isolating layer, BOX, silicon oxide
3. Source zone/Drain zone
4. Gate
5. Conduction channel
5a. Non-depletion zone
6. Isolating trenches, STI (Shallow Trench Isolation)
a6. Angle between the surface of the etched portion of the isolating trench with the surface of the tapered active layer 22
L6. Width of the isolating trench
6a. Unetched portion of the isolating trench
L6a Width of the isolating trench covered by the resin layer 8
6b. Etched portion of the isolating trench
L6b. Width of the isolating trench not covered by the resin layer 8
7. Hard mask
7a. Oxide layer
8. Resin layer (soft mask)
9. Sacrificial oxide layer
10. PDSOI transistor
e10. Thickness of the conduction channel of the PDSOI transistor
11. First active region
L1. Width of the active layer of the first active region
20. FDSOI transistor
e20. Thickness of the conduction channel of the FDSOI transistor
21. Second active region
L2. Width of the active layer of the second active region
22. Tapered active layer
22a. Rounded edge of the tapered active layer
e22. Thickness of the tapered active layer, Thickness of the conduction channel of the FDSOI transistor
30. Initial displacement
h1. Height of the initial displacement
40. Final displacement
h2. Height of the final displacement
50. Structural anomaly
60. Etching

The invention claimed is:

1. A method for forming an electronic device configured to house at least one first transistor and at least one second transistor, the at least one first transistor having a conduction channel, of which a thickness e10 is greater than a thickness e22 of a conduction channel of the at least one second transistor, from a stack of layers comprising at least one isolating layer surmounted by at least one active layer made of a semi-conductive material, the method comprising at least the following steps:

a) forming at least one isolating trench through a thickness of the at least one active layer to define, in the at least one active layer, on either side of the at least one isolating trench, at least one first active region intended for the formation of the at least one first transistor and at least one second active region intended for the formation of the at least one second transistor, said at least one isolating trench protruding with respect at least to the at least one active layer of the at least one second active region;

b) forming, above the at least one first active region and a portion of the at least one isolating trench, at least one masking layer without covering the at least one active layer of the at least one second active region and without covering a portion, the portion being called an uncovered portion, of the at least one isolating trench; and c) simultaneously, dry etching:
i) of a portion of the thickness of the at least one active layer of the at least one second active region so as to form at least one tapered active layer at a level of the at least one second active region and to obtain, in the at least one second active region, a thickness e22 of the at least one tapered active layer lower than the thickness e10 of the at least one first active region, the at least one tapered active layer configured to partially form at least the conduction channel of the at least one second transistor and the at least one active layer of the at least one first active region configured to partially form at least the conduction channel of the at least one first transistor, and ii) of at least one portion of a thickness of the uncovered portion of the at least one isolating trench so as to form an etched portion of the at least one isolating trench, and such that the at least one tapered active layer protrudes with respect to the etched portion of the at least one isolating trench.

2. The method according to claim 1, wherein the dry etching step is carried out by an etching having an etching speed of the at least one active layer less than an etching speed of the at least one isolating trench.

3. The method according to claim 1, wherein the at least one first transistor is a Partially Depleted Semiconductor On Insulator (PDSOI)-type transistor.

4. The method according to claim 1, wherein the at least one second transistor is an Fully Depleted Semiconductor On Insulator (FDSOI)-type transistor.

5. The method according to claim 1, wherein the dry etching step is carried out by an etching having an etching speed of the at least one isolating trench greater than an etching speed of the at least one active layer and less than or equal to twice the etching speed of the at least one active layer.

6. The method according to claim 1, wherein, before the dry etching step, the at least one isolating trench protrudes with respect to the at least one active layer of the at least one second active region such that a difference in height $h1$ between a surface of the at least one isolating trench and a surface of the at least one active layer of the at least one second active region is between 0 and 40 nm.

7. The method according to claim 1, wherein, after the dry etching step, the at least one tapered active layer of the at least one second active region protrudes with respect to the etched portion of the at least one isolating trench such that a difference in height $h2$ between a surface of the at least one tapered active layer and a surface of the etched portion of the at least one isolating trench is between 7 nm and 68 nm.

8. The method according to 7, wherein, before the dry etching step, the at least one isolating trench protrudes with respect to the at least one active layer of the at least one second active region such that a difference in height $h1$ between the surface of the at least one isolating trench and the surface of the at least one active layer of the at least one second active region is between 0 and 40 nm, and wherein a ratio between $h2$ and the thickness $e22$ of the at least one tapered active layer of the at least one second active region is between 0.1 and 0.9 and wherein a ratio between $h1$ and a thickness $e1$ of the at least one active layer of the at least one first active region is less than 0.3.

9. The method according to claim 1, wherein a ratio between the thickness $e22$ of the at least one tapered active layer of the at least one second active region and the thickness $e10$ of the at least one active layer of the at least one first active region is between 0.41 and 0.62.

10. The method according to claim 1, wherein the thickness $e22$ of the at least one tapered active layer of the at least one second active region is between 60 nm and 90 nm, and wherein the thickness $e10$ of the at least one active layer of the at least one first active region is between 130 nm and 160 nm.

11. The method according to claim 1, wherein the dry etching is an etching by plasma.

12. The method according to claim 11, wherein the plasma is a high density plasma.

13. The method according to claim 1, wherein the at least one masking layer comprises at least one resin.

14. The method according to claim 1 comprising, after the dry etching step, a step of removing the at least one masking layer.

15. The method according to claim 14, wherein the step of removing the at least one masking layer is followed by a step of cleaning one portion at least of the at least one tapered active layer of the at least one second active region.

16. The method according to claim 15, after the step of removing the at least one masking layer, a step of forming at least one sacrificial oxide layer at a level at least of the at least one tapered active layer of the at least one second active region.

17. The method according to claim 16, wherein the at least one sacrificial oxide layer is formed by an oxidation step over a portion of the thickness $e22$ of the at least one tapered active layer of the at least one second active region.

18. The method according to claim 16, wherein the step of forming the at least one sacrificial oxide layer comprises at least one oxidation step at a temperature of between 500° C. and 1100° C. of at least one portion of the at least one tapered active layer of the at least one second active region so as to form said at least one sacrificial oxide layer.

19. The method according to claim 16, wherein the at least one sacrificial oxide layer has a thickness comprised between 3 nm and 20 nm.

20. The method according to claim 16, wherein the at least one active layer has an initial thickness $e1$ comprised between 130 nm and 160 nm.

21. The method according to claim 15, wherein the step of cleaning comprises a wet etching.

* * * * *